(12) United States Patent
Zhang

(10) Patent No.: US 12,514,064 B2
(45) Date of Patent: Dec. 30, 2025

(54) DISPLAY PANEL INCLUDING FIRST METAL FILM, SECOND METAL FILM, THIRD METAL FILM, AND OXIDE SEMICONDUCTOR LAYER, METHOD OF MANUFACTURING SAME

(71) Applicant: Shenzhen China Star Optoelectronics Semiconductor Display Technology Co., Ltd., Guangdong (CN)

(72) Inventor: Letao Zhang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 980 days.

(21) Appl. No.: 17/593,119

(22) PCT Filed: May 25, 2021

(86) PCT No.: PCT/CN2021/095641
§ 371 (c)(1),
(2) Date: Sep. 9, 2021

(87) PCT Pub. No.: WO2022/227154
PCT Pub. Date: Nov. 3, 2022

(65) Prior Publication Data
US 2023/0189564 A1 Jun. 15, 2023

(30) Foreign Application Priority Data
Apr. 29, 2021 (CN) .......... 202110473178.8

(51) Int. Cl.
*H10K 59/121* (2023.01)
*H10K 59/12* (2023.01)

(52) U.S. Cl.
CPC ..... *H10K 59/1213* (2023.02); *H10K 59/1201* (2023.02); *H10K 59/1216* (2023.02)

(58) Field of Classification Search
CPC .......... H10K 59/1201; H10K 59/1213; H10K 59/1216; H10K 59/126; H10K 59/131; H10D 30/6723; H10D 86/441
(Continued)

(56) References Cited

U.S. PATENT DOCUMENTS

2016/0141349 A1* 5/2016 Yun .............. H10K 59/126
438/23
2017/0170252 A1 6/2017 Kim
2021/0391358 A1* 12/2021 Wang ............ H01L 27/1255

FOREIGN PATENT DOCUMENTS

CN 105609528 A 5/2016
CN 110112183 A 8/2019
(Continued)

*Primary Examiner* — Nduka E Ojeh

(57) ABSTRACT

A display panel, a method of manufacturing the same, and a display device are disclosed. Each of a first metal layer and a third metal layer of the display panel is formed by patterning a composite metal layer. A photolithography process is performed on the composite metal layer to form a first plate of a storage capacitor in a light-emitting area. A second plate of the storage capacitor is formed in the light-emitting area at the same time as a transparent oxide semiconductor layer is processed. Each of the first plate and the second plate is a transparent conductive film, so that a problem of low aperture ratios with current bottom-emission type active-matrix organic light-emitting diode (AMOLED) devices can be alleviated.

20 Claims, 8 Drawing Sheets

(58) Field of Classification Search
USPC .......................................................... 257/40
See application file for complete search history.

(56) References Cited

FOREIGN PATENT DOCUMENTS

| | | | | |
|---|---|---|---|---|
| CN | 110491886 A | * | 11/2019 | ......... H01L 27/1225 |
| CN | 110534549 A | | 12/2019 | |
| CN | 110610964 A | | 12/2019 | |
| CN | 110808276 A | | 2/2020 | |
| CN | 110890408 A | | 3/2020 | |
| CN | 110931510 A | | 3/2020 | |
| CN | 111668242 A | | 9/2020 | |
| IN | 109585520 A | | 4/2019 | |

\* cited by examiner

DISPLAY PANEL INCLUDING FIRST METAL FILM, SECOND METAL FILM, THIRD METAL FILM, AND OXIDE SEMICONDUCTOR LAYER, METHOD OF MANUFACTURING SAME

BACKGROUND OF INVENTION

1. Field of Invention

The present invention relates to a technical field of displays, and more particularly to a display panel, a method of manufacturing the display panel, and a display device.

2. Related Art

Compared to liquid crystal displays (LCDs), active-matrix organic light-emitting diode (AMOLED) displays have advantages of high color gamut, high contrast, flexibility, and wearability, and have gradually become a trend in development of display industries. AMOLED devices can be classified into top emission and bottom emission types according to directions of light emission. However, the bottom-emission type AMOLED devices are limited by opacity of storage capacitors, resulting in low aperture ratios.

Therefore, it is imperative to overcome a problem of the low aperture ratios with current bottom-emission type AMOLED devices.

SUMMARY OF INVENTION

An object of the present invention is to provide a display panel, a method of manufacturing the display panel, and a display device to alleviate a technical problem of low aperture ratios with current bottom emission type active-matrix organic light-emitting diode (AMOLED) devices.

In order to achieve the above-mentioned object, the present application provides the technical solution as follows:

An embodiment of the present application provides a display panel, comprising a plurality of subpixels, each of the subpixels comprising a transistor area and a light-emitting area, the transistor area provided with a thin-film transistor, the light-emitting area provided with a storage capacitor and a light-emitting unit located above the storage capacitor, and the light-emitting unit having a light output surface facing the storage capacitor, wherein the display panel comprises a substrate; a first metal layer disposed on the substrate and comprising a light-shielding layer having a two-layered structure disposed in the transistor area, and a first transparent conductive electrode having a single-layered structure disposed in the light-emitting area; an oxide semiconductor layer disposed on the first metal layer and comprising an active region of the thin-film transistor disposed in the transistor area and a second transparent conductive electrode disposed in the light-emitting area; a second metal layer disposed on the oxide semiconductor layer and comprising a gate electrode of the thin-film transistor in the transistor area; and a third metal layer disposed on the second metal layer and comprising a source electrode and a drain electrode each having a two-layered structure disposed in the transistor area, and a third transparent conductive electrode having a single-layered structure disposed in the light-emitting area; wherein a first plate is defined by electrical connection of the first transparent conductive electrode and the third transparent conductive electrode, and a second plate is defined by the second transparent conductive electrode.

In the display panel provided by an embodiment of the present application, each of the source electrode, the drain electrode, and the light-shielding layer comprises a transparent conductive film and a first metal film laminated together, wherein the first metal film is disposed on the transparent conductive film.

In the display panel provided by an embodiment of the present application, each of the first transparent conductive electrode and the second transparent conductive electrode comprises the transparent conductive film.

In the display panel provided by an embodiment of the present application, at least one of the first metal layer, the oxide semiconductor layer, or the third metal layer in the light-emitting area further comprises a transparent wire having a single-layered structure, and the transparent wire is disposed corresponding to the light-emitting unit.

In the display panel provided by an embodiment of the present application, the display panel further comprises an outer trace area, wherein the light-emitting area is defined between the transistor area and the outer trace area, and at least one of the first meal layer or the third metal layer further comprises an outer trace having a two-layered structure in the outer trace area.

In the display panel provided by an embodiment of the present application, the transparent conductive film comprises a film made of indium-based, zinc-based, or titanium-based doped transparent oxide materials.

In the display panel provided by an embodiment of the present application, the first metal film is made of a material comprising one or a combination of molybdenum (Mo), aluminum (Al), titanium (Ti), or copper (Cu).

In the display panel provided by an embodiment of the present application, the display panel further comprises a passivation layer, a planarization layer, a pixel electrode, and a pixel definition layer disposed in a stacked arrangement on the third metal layer, wherein a first via hole is defined on the pixel definition layer, the first via hole exposes the pixel electrode, and the light-emitting unit is disposed in the first via hole.

In the display panel provided by an embodiment of the present application, the display panel further comprises a color filter layer disposed between the passivation layer and the planarization layer and located corresponding to the first via hole.

In the display panel provided by an embodiment of the present application, an orthographic projection of the color filter layer on the substrate covers an orthographic projection of the light-emitting unit on the substrate.

An embodiment of the present application further provides a method of manufacturing a display panel, wherein the display panel comprises a plurality of subpixels, each of the subpixels comprising a transistor area and a light-emitting area, the transistor area provided with a thin-film transistor, the light-emitting area provided with a storage capacitor and a light-emitting unit located above the storage capacitor, and the light-emitting unit having a light output surface facing the storage capacitor, wherein the method of manufacturing the display panel comprises providing a substrate; fabricating a first composite metal layer on the substrate, performing a photolithography process by a first halftone mask on the first composite metal layer to form a first metal layer, wherein the first metal layer comprises a light-shielding layer having a two-layered structure disposed in the transistor area, and a first transparent conductive electrode having a single-layered structure disposed in the light-emitting area; fabricating a buffer layer on the first metal layer, preparing an oxide semiconductor film on the buffer layer, and performing a photolithography process on the oxide semiconductor film to form an oxide semiconductor layer, wherein the oxide semiconductor layer comprises an active region of the thin-film transistor disposed in the transistor area and an oxide semiconductor pattern formed in the light-emitting area; fabricating a gate insulating layer on the oxide semiconductor layer and preparing a second metal film on the gate insulating layer, performing a photolithography process on the second metal film to form a second metal layer, wherein the second metal layer comprises a gate electrode of the thin-film transistor in the transistor area, and conductorizing the oxide semiconductor layer, so that the oxide semiconductor pattern is formed into a second transparent conductive electrode; and fabricating an interlayer dielectric layer on the second metal layer, preparing a second composite metal layer on the interlayer dielectric layer, and performing a photolithography process by a second halftone mask on the second composite metal layer to form a third metal layer, wherein the third metal layer comprises a source electrode and a drain electrode each having a two-layered structure formed in the transistor area, and a third transparent conductive electrode having a single-layered structure formed in the light-emitting area, wherein the third transparent conductive electrode and the first transparent conductive electrode are electrically connected to form a first plate of the storage capacitor, and the second transparent conductive electrode is formed as a second plate of the storage capacitor.

In the method of manufacturing the display panel provided by an embodiment of the present application, the method further comprises fabricating a passivation layer on the third metal layer, and preparing a color filter layer on the passivation layer, wherein the color filter layer is located corresponding to the light-emitting area; forming a planarization layer on the passivation layer and the color filter layer, and preparing a pixel electrode on the planarization layer, wherein the pixel electrode is connected to the source electrode and the drain electrode; forming a pixel definition layer on the pixel electrode and the planarization layer, wherein a first via hole is formed in the pixel definition layer, the first via hole exposes the pixel electrode, and the light-emitting unit is disposed in the first via hole and located corresponding to the color filter layer; and fabricating a cathode on the light-emitting unit and the pixel definition layer.

In the method of manufacturing the display panel provided by an embodiment of the present application, each of the first composite metal layer and the second composite metal layer comprises a transparent conductive film and a first metal film laminated together, wherein the first metal film is disposed on the transparent conductive film.

An embodiment of the present application further provides a display device, comprising a display panel, a circuit board bonded to the display panel, and a cover covering the display panel, wherein the display panel comprises a plurality of subpixels, each of the subpixels comprising a transistor area and a light-emitting area, the transistor area provided with a thin-film transistor, the light-emitting area provided with a storage capacitor and a light-emitting unit located above the storage capacitor, and the light-emitting unit having a light output surface facing the storage capacitor, wherein the display panel comprises a substrate; a first metal layer disposed on the substrate and comprising a light-shielding layer having a two-layered structure disposed in the transistor area, and a first transparent conductive electrode having a single-layered structure disposed in the light-emitting area; an oxide semiconductor layer disposed on the first metal layer and comprising an active region of the thin-film transistor disposed in the transistor area and a second transparent conductive electrode disposed in the light-emitting area; a second metal layer disposed on the oxide semiconductor layer and comprising a gate electrode of the thin-film transistor in the transistor area; and a third metal layer disposed on the second metal layer and comprising a source electrode and a drain electrode each having a two-layered structure disposed in the transistor area, and a third transparent conductive electrode having a single-layered structure disposed in the light-emitting area; wherein a first plate is defined by electrical connection of the first transparent conductive electrode and the third transparent conductive electrode, and a second plate is defined by the second transparent conductive electrode.

In the display device provided by an embodiment of the present application, each of the source electrode, the drain electrode, and the light-shielding layer comprises a transparent conductive film and a first metal film laminated together, wherein the first metal film is disposed on the transparent conductive film.

In the display device provided by an embodiment of the present application, each of the first transparent conductive electrode and the second transparent conductive electrode comprises the transparent conductive film.

In the display device provided by an embodiment of the present application, at least one of the first metal layer, the oxide semiconductor layer, or the third metal layer in the light-emitting area further comprises a transparent wire having a single-layered structure, and the transparent wire is disposed corresponding to the light-emitting unit.

In the display device provided by an embodiment of the present application, the display device further comprises an outer trace area, wherein the light-emitting area is defined between the transistor area and the outer trace area, and at least one of the first meal layer or the third metal layer further comprises an outer trace having a two-layered structure in the outer trace area.

In the display device provided by an embodiment of the present application, the transparent conductive film comprises a film made of indium-based, zinc-based, or titanium-based doped transparent oxide materials.

The present application has advantageous effects as follows: the present application provides a display panel and a method of manufacturing the same, and a display device. Each of a first metal layer and a third metal layer of the display panel is constructed with a composite film layer having a first metal film and a transparent conductive film, and a halftone mask is used to perform a photolithography process on the first metal layer and the second metal layer. While forming a thin-film transistor device, a first plate of a transparent storage capacitor is formed in a light-emitting area, and a second plate of the transparent storage capacitor is formed in the light-emitting area at the same time as the active region is formed in a oxide semiconductor layer, so that the light emitted by a light-emitting unit can pass through the storage capacitor, thereby increasing the aperture ratio of the display panel, as well as increasing the storage capacity of the storage capacitor. In addition, while forming the transparent first plate and the transparent second plate of the storage capacitor, a transparent wire is also formed in the corresponding light-emitting area, thereby further improving the aperture ratio of the display panel.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show certain embodiments of the present invention, and those skilled in the art may still derive other drawings from these accompanying drawings without creative efforts.

DESCRIPTION OF PREFERRED EMBODIMENTS

Figure 1:
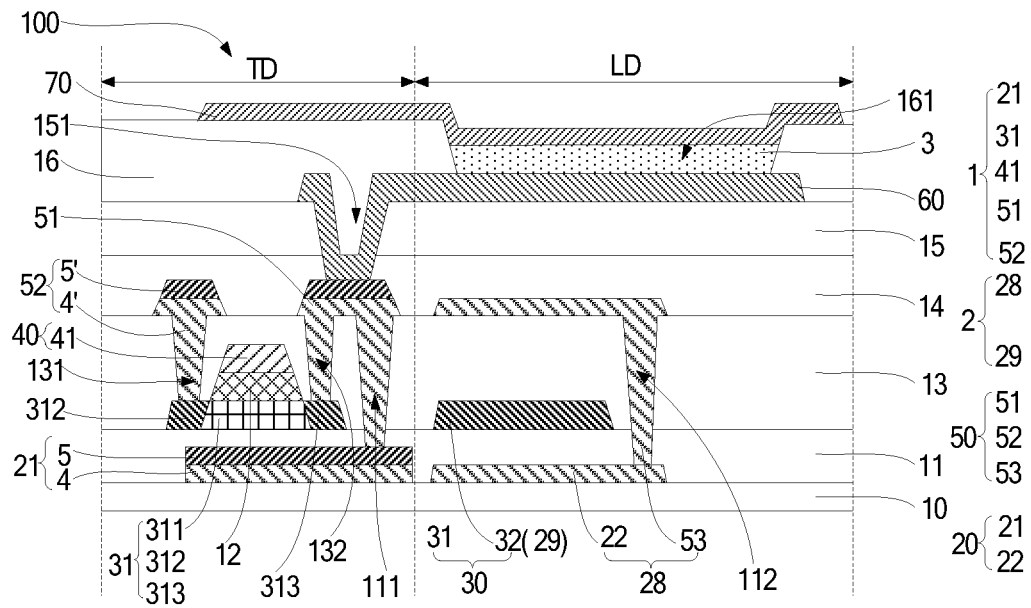
FIG. 1 is a schematic cross-sectional, structural view of a display panel provided by an embodiment of the present application.

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto. In the drawings, units with similar structures are indicated by the same reference numerals. In the drawings, for clear understanding and ease of description, the thickness of some layers and regions are exaggerated. That is, the size and thickness of each component shown in the drawings are arbitrarily shown, but the application is not limited thereto.

In one embodiment, please refer to FIG. 1, which is a schematic cross-sectional, structural view of a display panel provided by an embodiment of the present application. The display panel 100 includes an organic light-emitting diode (OLED) display panel, etc., for example, an active-matrix organic light-emitting diode (AMOLED) display panel. The display panel 100 includes a plurality of subpixels, and each of the subpixels includes a transistor area TD and a light-emitting area LD. The transistor area TD is provided with a thin-film transistor 1, the light-emitting area LD is provided with a storage capacitor 2 and a light-emitting unit 3 located above the storage capacitor 2, and the light-emitting unit 3 has a light output surface facing the storage capacitor 2.

Specifically, the display panel 100 includes a substrate 10, a first metal layer 20 disposed on the substrate 10, a buffer layer 11 disposed on the first metal layer 20, an oxide semiconductor layer 30 disposed on the buffer layer 11, a gate insulating layer 12 disposed on the oxide semiconductor layer 30, a second metal layer 40 disposed on the gate insulating layer 12, an interlayer dielectric layer 13 disposed on the second metal layer 40, and a third metal layer 50 disposed on the interlayer dielectric layer 13.

Optionally, the substrate 10 may be a rigid substrate or a flexible substrate. When the substrate 10 is the rigid substrate, it may include the rigid substrate such as a glass substrate. When the substrate 10 is the flexible substrate, it may include the flexible substrate such as a polyimide (PI) film, an ultra-thin glass film, etc.

The first metal layer 20 includes a light-shielding layer 21 having a two-layered structure disposed in the transistor area TD, and a first transparent conductive electrode 22 having a single-layered structure disposed in the light-emitting area LD. The light-shielding layer 21 includes a first metal film 5 and a transparent conductive film 4 laminated together. The first metal film 5 is disposed on the transparent conductive film 4, and the first transparent conductive electrode 22 includes the transparent conductive film 4. It can be understood that the first metal layer before being patterned is a first composite metal layer formed by the first metal film 5 and the transparent conductive film 4, and a photolithography process is performed on the first composite metal layer to form the first metal layer 20. The first metal layer 20 includes the light-shielding layer 21 having the two-layered structure disposed in the transistor area TD, and the first transparent conductive electrode 22 having the single-layered structure disposed in the light-emitting area LD.

The first metal film 5 is made of a material including one or a combination of molybdenum (Mo), aluminum (Al), titanium (Ti), or copper (Cu). The transparent conductive film 4 includes a film formed of a transparent conductive oxide (TCO). The transparent conductive oxide includes indium-based, zinc-based, titanium-based, and other doped transparent oxide materials, such as In2O3:Sn (abbreviated as ITO, indium tin oxide), ZnO:Al (abbreviated as AZO, aluminum zinc oxide), TiO2:Nb (abbreviated as NTO, niobium titanium oxide), etc.

Specifically, a photolithography process is performed by a halftone mask (HTM) on the first composite metal layer to form the first metal layer 20. Specifically, the first metal layer 20 includes the light-shielding layer 21 formed with the first metal film 5 and the transparent conductive film 4 laminated together in the transistor area TD, and the first transparent conductive electrode 22 having only the patterned transparent conductive film 4 formed in the light-emitting area LD.

The buffer layer 11 is disposed on the first metal layer 20 and is made of an inorganic material, such as silicon oxide, silicon nitride, silicon oxynitride, etc. The buffer layer 11 can prevent undesirable impurities or contaminants (such as moisture, oxygen, etc.) from diffusing from the substrate 10 into devices that may be damaged by these impurities or contaminants, and can also provide a flat top surface.

The oxide semiconductor layer 30 is disposed on the buffer layer 11, and a material of the oxide semiconductor layer 30 includes amorphous oxide semiconductor materials, such as indium-gallium-zinc oxide (IGZO), indium zinc oxide (IZO), indium zinc tin oxide (IZTO), etc. The oxide semiconductor layer 30 includes an active region 31 of the thin-film transistor 1 disposed in the transistor area TD and a second transparent conductive electrode 32 disposed in the light-emitting area LD. The active region 31 includes a channel region 311, and a source region 313 and a drain region 312 on both sides of the channel region 311, wherein the source region 313, the drain region 312, and the second transparent conductive electrode 32 are all formed by conductorizing the oxide semiconductor layer 30. The active region 31 is disposed corresponding to the light-shielding layer 21. The light-shielding layer 21 is configured to shield the active region 31 to prevent light from irradiating the channel region 311.

The gate insulating layer 12 is disposed on the oxide semiconductor layer 30. The second metal layer 40 is disposed on the gate insulating layer 12 and includes a gate electrode 41 of the thin-film transistor 1 formed in the transistor region TD. The gate electrode 41 and the gate insulating layer 12 are both disposed corresponding to the channel region 311 of the active region 31.

The interlayer dielectric layer 13 is disposed on the second metal layer 40, the second transparent conductive electrode 32, and the buffer layer 11, and the third metal layer 50 is disposed on the interlayer dielectric layer 13. The third metal layer 50 includes a source electrode 51 and a drain electrode 52 each having a two-layered structure disposed in the transistor area TD, and a third transparent conductive electrode 53 having a single-layered structure disposed in the light-emitting area LD.

Each of the source electrode 51 and the drain electrode 52 includes a first metal film 5' and a transparent conductive film 4' laminated together. The first metal film 5' is disposed on the transparent conductive film 4', and the transparent conductive electrode 53 includes the transparent conductive film 4'. The first metal film 5' and the first metal film 5 may be made of a same material, and the transparent conductive film 4 and the transparent conductive film 4' may be made of a same material. It can also be understood that the third metal layer before being patterned is a second composite metal layer formed by the first metal film 5' and the transparent conductive film 4', and the photolithography process is performed on the second composite metal layer to form the third metal layer 50. The third metal layer 50 includes the source electrode 51 and the drain electrode 52 each having the two-layered structure disposed in the transistor area TD, and the third transparent conductive electrode 53 having the single-layered structure disposed in the light-emitting area LD.

The drain electrode 52 connects to the drain region 312 through a second via hole 131 extending through the interlayer dielectric layer 13. The source electrode 51 connects to the source region 313 through a third via hole 132 extending through the interlayer dielectric layer 13 and further connects to the light-shielding layer 21 through a fourth via hole 111 extending through the interlayer dielectric layer 13 and the buffer layer 11. The third transparent conductive electrode 53 connects to the first transparent conductive electrode 22 though a fifth via hole 112 extending through the interlayer dielectric layer 13 and the buffer layer 11.

Optionally, the halftone mask is used to perform the photolithography process on the second composite metal layer to form the third metal layer 50. The third metal layer 50 includes the source electrode 51 and the drain electrode 52 each formed by the first metal film 5' and the transparent conductive film 4' laminated together in the transistor area TD, and the third transparent conductive electrode 53 having only the patterned transparent conductive film 4' formed in the light-emitting area LD.

Specifically, the first transparent conductive electrode 22 and the third transparent conductive electrode 53 are electrically connected to form a first plate 28 of the storage capacitor 2, and the second transparent conductive electrode 32 serves as a second plate 29 of the storage capacitor 2. The first plate 28, the second plate 29, the buffer layer 11, and the interlayer dielectric layer 13 construct the storage capacitor 2.

Certainly, the display panel 100 further inçudes a passivation layer 14, a planarization layer 15, a pixel electrode 60, and a pixel definition layer 16 disposed in a stacked arrangement on the third metal layer 50.

Specifically, the passivation layer 14 covers the third metal layer 50 and the interlayer dielectric layer 13, and the planarization layer 15 covers the passivation layer 14. The planarization layer 15 is made of a material containing organic materials and is configured to provide a planarization top surface.

The pixel electrode 60 is disposed on the planarization layer 15 and is connected to the source region 51 through a sixth via hole 151 extending through the planarization layer 15 and the passivation layer 14. The pixel electrode 60 is a transparent electrode and is made of a transparent conductive material such as ITO.

The pixel definition layer 16 is disposed on the pixel electrode 60 and the planarization layer 15 and is made of a material containing an organic photoresist, which may be one of PI-based (polyimide), acrylic, or other organic photoresists. The pixel definition layer 16 is provided with a first via hole 161 at a position corresponding to the pixel electrode 60. The first via hole 161 exposes the pixel electrode 60, and the light-emitting unit 3 is disposed in the first via hole 161.

The light-emitting unit 3 has the light output surface facing the storage capacitor 2, that is, the display panel 100 adopts bottom emission. Since the pixel electrode 60 and the storage capacitor 2 are made of transparent electrode materials, the light emitted by the light-emitting unit 3 can penetrate the pixel electrode 60 and the storage capacitor 2. In addition, the storage capacitor 2 disposed in the light-emitting area reduces area of a non-light-emitting area of the display panel 100 and increases an aperture ratio of the display panel 100.

It should be noted that, in order to realize light emission of the light-emitting unit 3, a cathode 70 needs to be provided. The cathode 70 covers the light-emitting unit 3 and the pixel definition layer 16. The light-emitting unit 3 emits light under a combined action of the pixel electrode 60 and the cathode 70. Since the display panel 100 of the present application is a bottom-emission type display panel, the cathode 70 may be a reflective electrode to improve a light utilization rate of the light-emitting unit 3.

In addition, the display panel 10 further includes an encapsulation layer (not shown) disposed on the cathode 70. The encapsulation layer can be a thin-film encapsulation structure. The thin-film encapsulation structure may be a laminated structure formed by three film layers of a first inorganic encapsulation layer, an organic encapsulation layer, and a second inorganic encapsulation layer sequentially laminated, or may be a laminated structure of more layers for protecting the light-emitting unit 3, thereby preventing moisture and oxygen from entering the light-emitting unit 3 that results in failure of light-emitting materials of the light-emitting unit 3.

Figure 2:
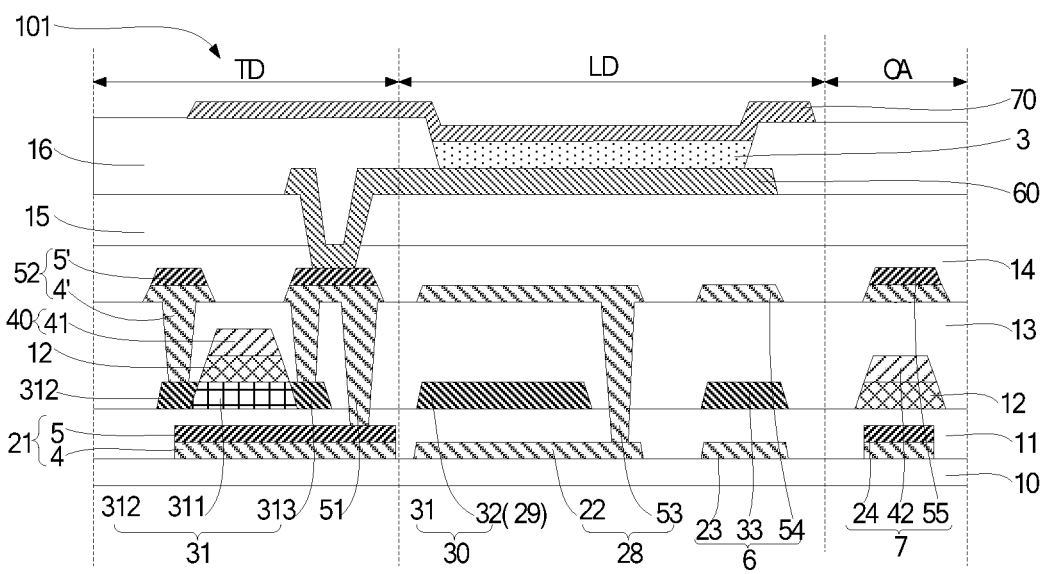
FIG. 2 is another schematic cross-sectional, structural view of a display panel provided by an embodiment of the present application.

In one embodiment, please refer to FIG. 2, which is another schematic cross-sectional, structural view of the display panel provided by an embodiment of the present application. A difference from aforementioned embodiment lies in that at least one of the first metal layer 20, the oxide semiconductor layer 30, or the third metal layer 50 of a display panel 101 further includes a transparent wire 6 formed in the light-emitting area. The transparent wire 6 is disposed corresponding to the light-emitting unit 3.

As shown in FIG. 2, each of the first metal layer 20, the oxide semiconductor layer 30, and the third metal layer 50 further includes the transparent wire 6 having a single-layered structure formed in the light-emitting area, wherein a transparent wire 23 included in the first metal layer 20 and the first transparent conductive electrode 22 are disposed in a same layer and formed by a same process at the same time. A transparent wire 33 included in the oxide semiconductor layer 30 and the second transparent conductive electrode 32 are disposed in a same layer and formed by a same process at the same time. A transparent wire 54 included in the third metal layer 50 and the third transparent conductive electrode 53 are disposed in a same layer and formed by a same process at the same time. The transparent wires 6 include various internal connecting wires for connecting thin-film transistors and/or storage capacitors in a pixel driving circuit.

By setting various internal connecting traces connected to the thin film transistors and/or the storage capacitors as the transparent wire 6 in the pixel driving circuit and arranging the transparent wire 6 to correspond to the light-emitting unit 3 can further reduce the area of the non-light-emitting area of the display panel 100, thereby further increasing the aperture ratio of the display panel 100.

Certainly, the display panel 100 further includes an outer trace area OA. The light-emitting area LD is defined between the transistor area TD and the outer trace area OA, and the outer trace area OA is provided with various outer traces 7. The outer traces 7 are configured to provide a driving signal to the thin-film transistor 1 in the pixel driving circuit. Optionally, the outer traces 7 include data signal lines, gate scanning signal lines, sensing signal lines, etc., wherein at least one of the first meal layer 20, the second metal layer 40, or the third metal layer 50 further includes one of the outer traces 7, which are opaque wires. As shown in FIG. 2, the outer trace 7 may include an outer trace 24 of the first metal layer 20, an outer trace 42 of the second metal layer 40, and an outer trace 55 of the third metal layer 50, wherein the outer trace 24 of the first metal layer 20 and the outer trace 55 of the third metal layer 50 are both a two-layered laminated metal structure. The outer trace 24 of the first metal layer 20 and the light-shielding layer 21 are disposed in a same layer and formed by a same process at the same time. The outer trace 55 of the third metal layer 50 and the source electrode 51 and the drain electrode 52 are disposed in a same layer and formed by a same process at the same time.

Figure 3:
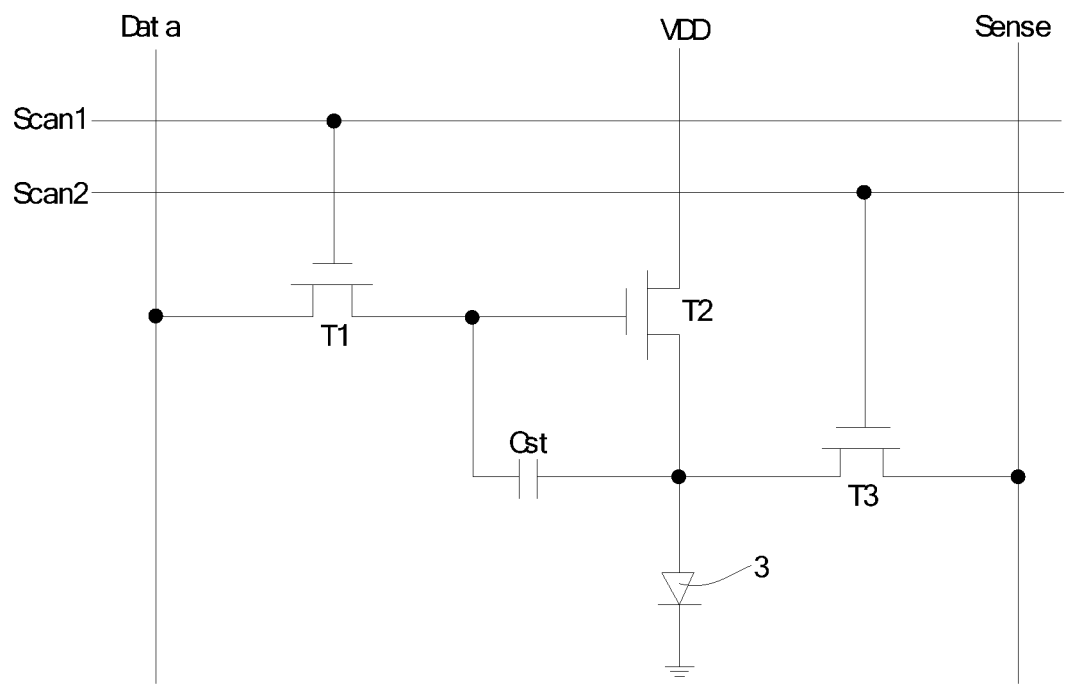
FIG. 3 is a schematic view of a pixel driving circuit provided in an embodiment of the application.

Optionally, please refer to FIG. 3, taking a 3T1C pixel driving circuit as an example to illustrate functions of the transparent wire 6 and the outer trace 7. The pixel driving circuit may include a first transistor T1, a second transistor T2, a third transistor T3, and a storage capacitor Cst. A first terminal of the first transistor T1 is connected to a data signal line Data, and a control terminal is connected to a first gate scanning signal line Scan1. A control end of the second transistor T2 is connected to a second end of the first transistor T1, a first end of the second transistor T2 is connected to a power signal line VDD, and the second end of the second transistor T2 is connected to the light-emitting unit 3. The storage capacitor Cst is connected between the second terminal and the control terminal of the second transistor T2. A control end of the third transistor T3 is connected to a second gate scanning signal line Scan2, a first end of the third transistor T3 is connected to a sensing signal line Sense, and a second end of the third transistor T3 is connected to the second end of the second transistor T2. The sensing signal line Sense may be used to sense an output current of a driving transistor when the second transistor T2 is turned on, so as to detect a threshold voltage and mobility of the second transistor T2. The sensing signal line Sense can also be used to input a constant voltage to the second end of the second transistor T2 during a light-emitting phase of the light-emitting unit 3, so as to control an output current of the second end of the second transistor T2 through a gate voltage of the second transistor T2.

The first gate scanning signal line Scan1, the second gate scanning signal line Scan2, the data signal line Data, and the sensing signal line Sense serve as the outer trace 7. Connecting wires between the first transistor T1, the second transistor T2, the third transistor T3, the outer trace 7, and the storage capacitor Cst are the transparent wires 6. For other descriptions, please refer to above-mentioned embodiment, which will not be repeated here.

Figure 4:
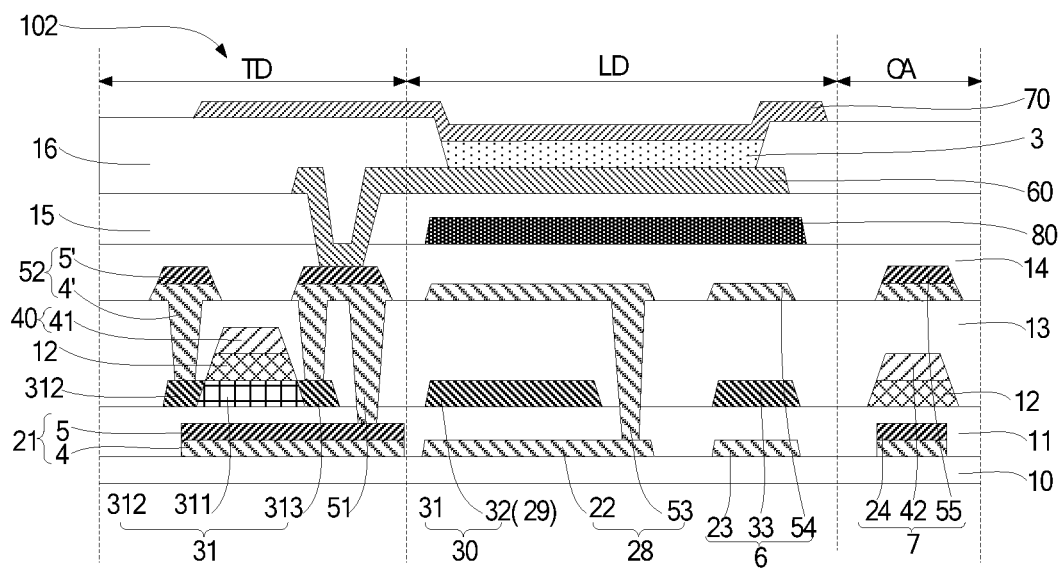
FIG. 4 is yet another schematic cross-sectional, structural view of a display panel provided by an embodiment of the present application.

In one embodiment, please refer to FIG. 4, which is yet another schematic cross-sectional, structural view of a display panel provided by an embodiment of the present application. A difference from the aforementioned embodiments lies in that a color filter layer 80 is further disposed between the passivation layer 14 and the planarization layer 15 of the display panel 102. The color filter layer 80 is located corresponding to the light-emitting unit 3, and an orthographic projection of the color filter layer 80 on the substrate 10 covers an orthographic projection of the light-emitting unit 3 on the substrate 10, so that all the light emitted by the light-emitting unit 3 can be directed toward the color filter layer 80. The color filter layer 80 includes a red color film, a green color film, and a blue color film, and each light-emitting unit 3 corresponds to one of the color films of one color. A white light emitted by the light-emitting unit 3 is converted into a red light through the red color film, converted into a green light through the green color film, and converted into a blue light through the blue color film, thereby realizing color display of the display panel 102. For other descriptions, please refer to the above-mentioned embodiment, which will not be repeated here.

Figure 5:
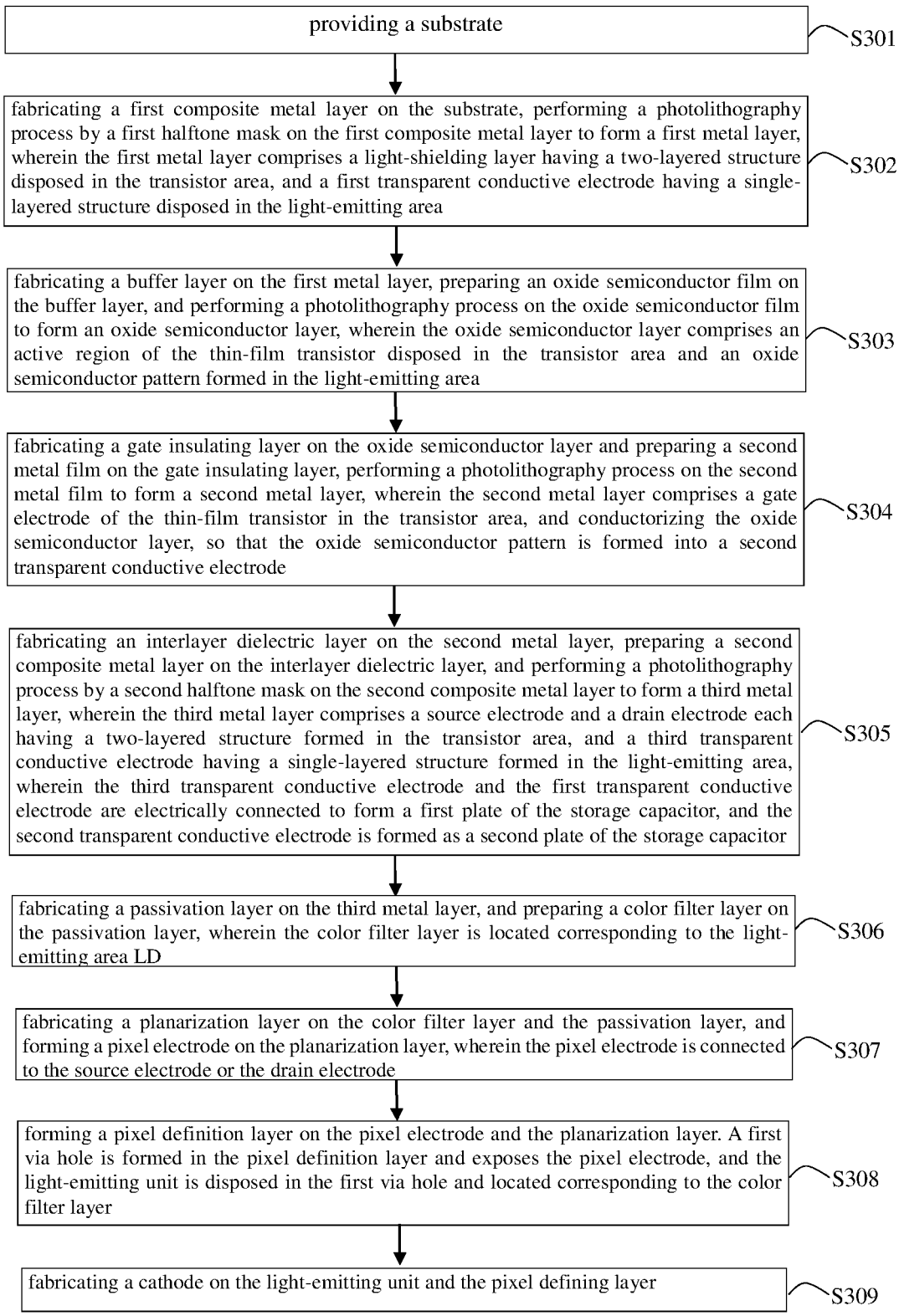
FIG. 5 is a flowchart of a method of manufacturing a display panel provided by an embodiment of the present application.
Figure 6:
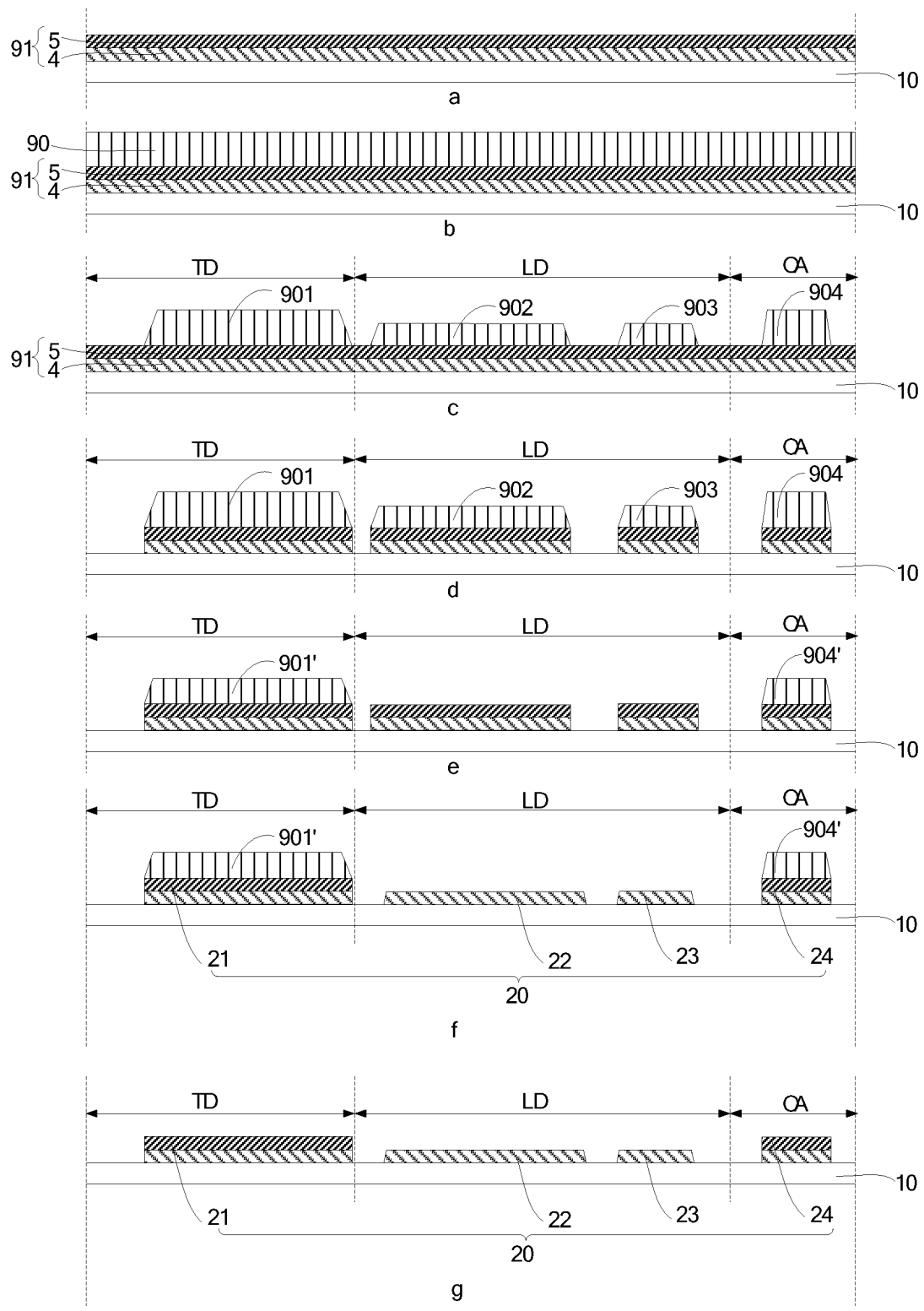
FIGS. 6 to 15 are schematic structural views of film layers of the display panel fabricated by each step of the method of manufacturing the display panel provided in an embodiment of the present application.

In one embodiment, the present application further provides a method of manufacturing a display panel. Please refer to FIGS. 5 to 13. FIG. 5 is a flowchart of the method of manufacturing the display panel provided by an embodiment of the present application. FIGS. 6 to 13 are schematic structural views of film layers of the display panel fabricated by each step of the method of manufacturing the display panel provided in an embodiment of the present application. The method of manufacturing the display panel 102 shown in FIG. 4 is taken as an example for description in this embodiment. Please refer to FIG. 4. The display panel 102 includes a plurality of subpixels, and each of the subpixels includes a transistor area TD and a light-emitting area LD. The transistor area TD is provided with a thin-film transistor 1, and the light-emitting area LD is provided with a storage capacitor 2 and a light-emitting unit 3 located above the storage capacitor 2. The light-emitting unit 3 has a light output surface facing the storage capacitor 2. The method of manufacturing the display panel includes steps as follows:

S301: providing a substrate 10;

Specifically, please refer to FIG. 6, the substrate 10 is provided. The substrate 10 may be a rigid substrate or a flexible substrate. When the substrate 10 is the rigid substrate, it may be a substrate having rigid characteristics such as a glass substrate. When the substrate 10 is the flexible substrate, it may be the flexible substrate such as a polyimide film, an ultra-thin glass film, etc.

S302: fabricating a first composite metal layer on the substrate 10, performing a photolithography process by a first halftone mask on the first composite metal layer to form a first metal layer 20. The first metal layer 20 includes a light-shielding layer 21 having a two-layered structure disposed in the transistor area TD, and a first transparent conductive electrode 22 having a single-layered structure disposed in the light-emitting area LD.

Specifically, please refer to part a shown in FIG. 6. A first composite metal layer 91 is deposited on the substrate 10, and the first composite metal layer 91 includes a first metal film 5 and a transparent conductive film 4 laminated together. The first metal film 5 is disposed on the transparent conductive film 4, wherein the first metal film is made of a material including one or a combination of Mo, Al, Ti, or Cu. The transparent conductive film 4 includes a film formed of a transparent conductive oxide. The transparent conductive oxide includes indium-based, zinc-based, titanium-based, and other doped transparent oxide materials, such as In2O3:Sn (abbreviated as ITO, indium tin oxide), ZnO:Al (abbreviated as AZO, aluminum zinc oxide), TiO2:Nb (abbreviated as NTO, niobium titanium oxide), etc.

Optionally, the transparent conductive film 4 is an ITO film. When the ITO film and the first metal film 5 are combined to form the first composite metal layer, the first metal film 5 needs to be deposited at room temperature to prevent the ITO film from crystallizing and failing to be patterned. When the first composite metal layer is composited by an AZO film and the first metal film 5, or is composited by an NTO film and the first metal film 5, a deposition temperature of the first metal film 5 is not limited.

Specifically, the first halftone mask may be used to perform the photolithography process on the first composite metal layer 91 to form the first metal layer 20. Specific steps are as follows:

As part b shown in FIG. 6, a full surface of the first composite metal layer 91 is coated with a photoresist 90.

As part c shown in FIG. 6, expose and develop the photoresist 90 to form a plurality of photoresist patterns. The photoresist patterns include a first photoresist pattern 901 formed in the transistor area TD, a second photoresist pattern 902 and a third photoresist pattern 903 formed in the light-emitting area LD, and a fourth photoresist pattern 904 formed in an outer trace area OA, wherein the first photoresist pattern 901 and the fourth photoresist pattern 904 have a same thickness, the second photoresist pattern 902 and the third photoresist pattern 903 have a same thickness, and a thickness of each of the first photoresist pattern 901 and the fourth photoresist pattern 904 is greater than a thickness of each of the second photoresist pattern 902 and the third photoresist pattern 903.

As part d shown in FIG. 6, the first photoresist pattern 901, the second photoresist pattern 902, the third photoresist pattern 903, and the fourth photoresist pattern 904 are used as shields for performing a first etching on the first composite metal layer 91, so that the first composite metal layer 91 forms a light-shielding layer pattern in the transistor area TD. Form a first transparent conductive electrode pattern and a transparent wire pattern in the light-emitting area LD, and form an outer trace pattern in the outer trace area OA.

As part e shown in FIG. 6, perform an ashing treatment on the first photoresist pattern 901, the second photoresist pattern 902, the third photoresist pattern 903, and the fourth photoresist pattern 904 to reduce the thicknesses of the first photoresist pattern 901 and the fourth photoresist pattern 904, so that a thinned first photoresist pattern 901' and a thinned fourth photoresist pattern 904' are formed, and to ash the second photoresist pattern 902 and the third photoresist pattern 903 completely, so that the first transparent conductive electrode pattern and the transparent wire pattern are exposed.

As part f shown in FIG. 6, use the thinned first photoresist pattern 901' and the thinned fourth photoresist pattern 904' as a shield to perform a second etching on the light-shielding layer pattern, the first transparent conductive electrode pattern, the transparent wire pattern, and the outer trace pattern to form the first metal layer 20. The first metal layer 20 includes the light-shielding layer 21 formed in the transistor area TD, and the first transparent conductive electrode 22 and a transparent wire 23 formed in the light-emitting area LD. Since the first transparent conductive electrode pattern and the transparent wire pattern are not covered with the photoresist pattern, after the second etching, the first metal film 5 on the transparent conductive film 4 is etched away, so that the first transparent conductive electrode 22 and the transparent wire 23 are formed with only the transparent conductive film 4 as the single-layered structure, while the light-shielding layer pattern and the outer trace pattern are covered with the photoresist pattern, after the second etching, each of the light-shielding layer 21 and the outer trace 24 is formed with the first metal film 5 and the transparent conductive film 4 laminated together.

As part g shown in FIG. 6, the thinned first photoresist pattern 901' and the thinned fourth photoresist pattern 904' are peeled off to expose the first metal layer 20 completely.

S303: fabricating a buffer layer 11 on the first metal layer 20, preparing an oxide semiconductor film on the buffer layer 11, and performing a photolithography process on the oxide semiconductor film to form an oxide semiconductor layer 30. The oxide semiconductor layer 30 includes an active region 31 of the thin-film transistor disposed in the transistor area TD and an oxide semiconductor pattern formed in the light-emitting area LD.

Figure 7:
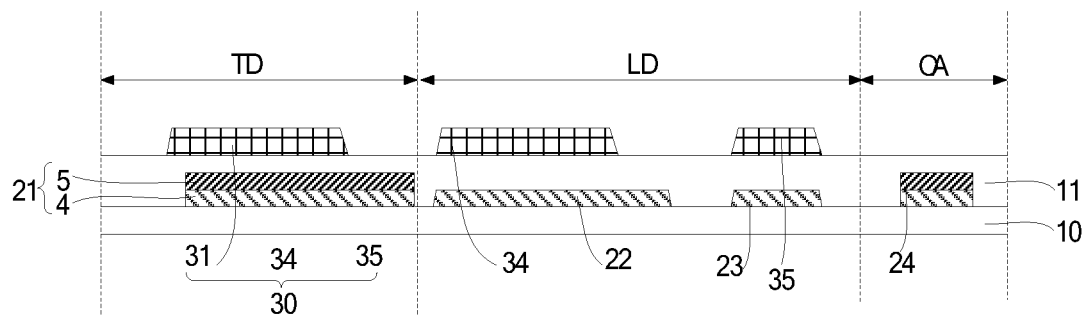

Specifically, please refer to FIG. 7. A deposition process such as plasma enhanced chemical vapor deposition (PECVD) is used to deposit the buffer layer 11 on the first metal layer 20 and the substrate 10. The buffer layer 11 is made of a material including one or a combination of inorganic materials including silicon oxide, silicon nitride, silicon oxynitride, etc., such as Si3N4, SiO2, SiON, and the like.

Further, a deposition process such as physical vapor deposition (PVD) is used to deposit the oxide semiconductor film on the buffer layer 11. A material of the oxide semiconductor film includes amorphous oxide semiconductor materials, such as IGZO, IZO, and IZTO. Pattern the oxide semiconductor film to form the oxide semiconductor layer 30. The oxide semiconductor layer 30 includes an active region 31 of the thin-film transistor 1 disposed in the transistor area TD, wherein the active region 31 is located corresponding to the light-shielding layer 21, and an oxide semiconductor pattern 34/35 is formed in the light-emitting region LD.

S304: fabricating a gate insulating layer 12 on the oxide semiconductor layer 30 and preparing a second metal film on the gate insulating layer 12, performing a photolithography process on the second metal film to form a second metal layer 40, wherein the second metal layer 40 includes a gate electrode 41 of the thin-film transistor in the transistor area TD, and conductorizing the oxide semiconductor layer 30, so that the oxide semiconductor pattern is formed into a second transparent conductive electrode 32.

Specifically, a gate insulating material is deposited on the oxide semiconductor layer 30 and the buffer layer 11 through a deposition process such as PECVD. The gate insulating material includes inorganic materials such as silicon oxide, silicon nitride, silicon oxynitride, etc.

Figure 8:
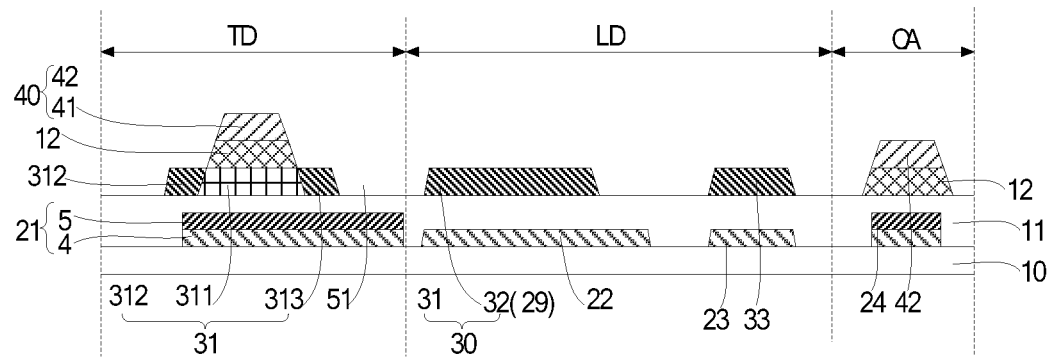

Further, use a deposition process such as PVD to deposit the second metal film on the gate insulating material, pattern the second metal film to form a gate electrode pattern in the transistor region TD, and form an outer trace pattern in the outer trace area OA. The gate electrode pattern and the outer trace pattern are used as a shield to perform an etching process on the gate insulating material, so that the gate electrode 41, the gate insulating layer 12, and an outer trace 42 are formed. Then, the oxide semiconductor layer 30 not covered by the gate electrode 41 is subjected to a conductorizing treatment, so that the active region 31 is formed into a channel region 311, and a source region 313 and a drain region 312 located on both sides of the channel region 311, so that the oxide semiconductor pattern 34/35 of the light-emitting region LD forms the second transparent conductive electrode 32 and a transparent trace 33, as shown in FIG. 8. The source region 313 and the drain region 312 have resistivity less than resistivity of the channel region 311. The active region 31 is disposed corresponding to the light-shielding layer 21, and the light-shielding layer 21 is configured to shield the active region 31 to prevent light from irradiating the channel region 311.

S305: fabricating an interlayer dielectric layer 13 on the second metal layer 40, preparing a second composite metal layer on the interlayer dielectric layer 13, and performing a photolithography process by a second halftone mask on the second composite metal layer to form a third metal layer 50. The third metal layer 50 includes a source electrode 15 and a drain electrode 52 each having a two-layered structure formed in the transistor area TD, and a third transparent conductive electrode 53 having a single-layered structure formed in the light-emitting area LD, wherein the third transparent conductive electrode 53 and the first transparent conductive electrode 22 are electrically connected to form a first plate 28 of the storage capacitor 2, and the second transparent conductive electrode 32 is formed as a second plate 29 of the storage capacitor 2.

Figure 9:
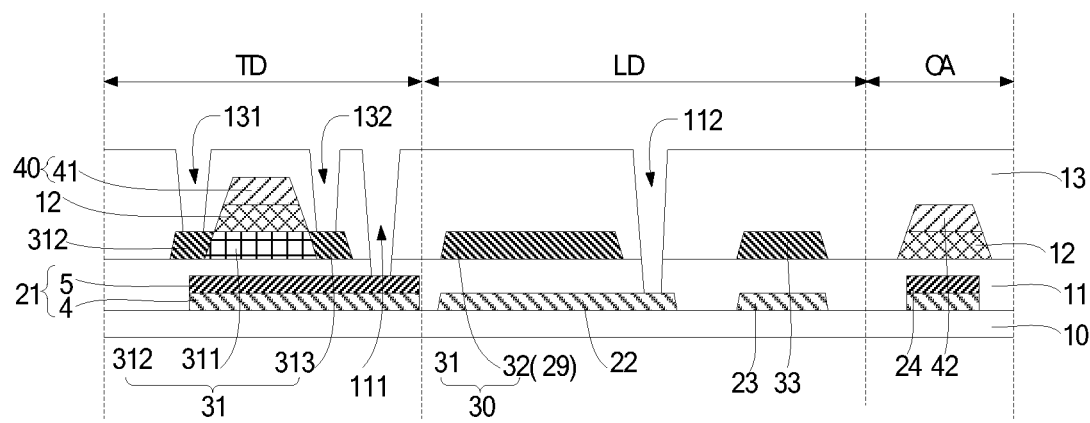

Specifically, a deposition process such as PECVD is used to deposit an inorganic thin film on the second metal layer 40, the oxide semiconductor layer 30, and the buffer layer 11 to form an interlayer dielectric layer 13. The interlayer dielectric layer 13 is patterned to form a second via hole 131, a third via hole 132, a fourth via hole 111, and a fifth via hole 112, as shown in FIG. 9. The second via hole 131 and the third via hole 132 both extend through the interlayer dielectric layer 13 to expose portions of the drain region 312 and the source region 313, respectively. The fourth via hole 111 and the fifth via hole 112 both extend through the interlayer dielectric layer 13 and the buffer layer 11 to expose portions of the light-shielding layer 21 and the first transparent conductive electrode 22, respectively.

Figure 10:
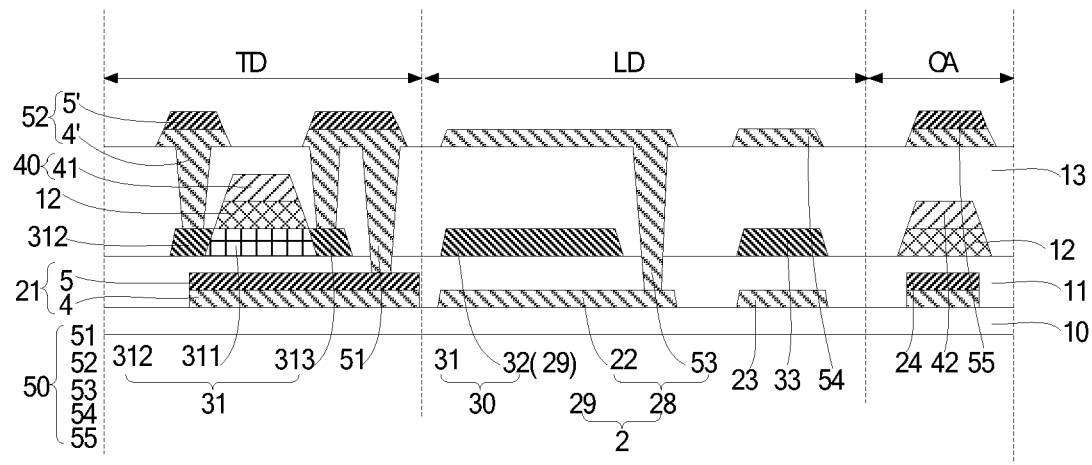

Further, a deposition process such as PVD is used to deposit a second composite metal layer on the interlayer dielectric layer 13, and a material of the second composite metal layer is the same as a material of the first composite metal layer 91. The second composite metal layer is patterned using a same process as patterning of the first composite metal layer 91 to form the third metal layer 50. Optionally, a second halftone mask is used to perform a photolithography process on the second composite metal layer to form the third metal layer 50. The third metal layer 50 includes the source electrode 51 and the drain electrode 52 of the thin-film transistor formed in the transistor area TD, the third transparent conductive electrode 53 and a transparent wire 54 formed in the light-emitting area LD, and an outer trace 55 formed in the outer trace area OA, as shown in FIG. 10. Each of the source electrode 51 and the drain electrode 52 of the thin-film transistor, and the outer trace 55 includes the first metal film 5' and the transparent conductive film 4' laminated together. The third transparent conductive electrode 53 and the transparent wire 54 have only the patterned transparent conductive film 4'.

Optionally, the drain electrode 52 is connected to the drain region 312 through a second via hole 131 of the interlayer dielectric layer 13. The source electrode 51 is connected to the source region 313 through a third via hole 132 of the interlayer dielectric layer 13, and the source electrode 51 is further connected to the light-shielding layer 21 through a fourth via 111 extending through the interlayer dielectric layer 13 and the buffer layer 11. The third transparent conductive electrode 53 is connected to the first transparent conductive electrode 22 though a fifth via hole 112 extending through the interlayer dielectric layer 13 and the buffer layer 11 to form the first plate 28 of the storage capacitor 2, and the second transparent conductive electrode 32 serves as the second plate 29 of the storage capacitor 2.

S306: fabricating a passivation layer 14 on the third metal layer 50, and preparing a color filter layer 80 on the passivation layer 14, wherein the color filter layer 80 is located corresponding to the light-emitting area LD.

Figure 11:
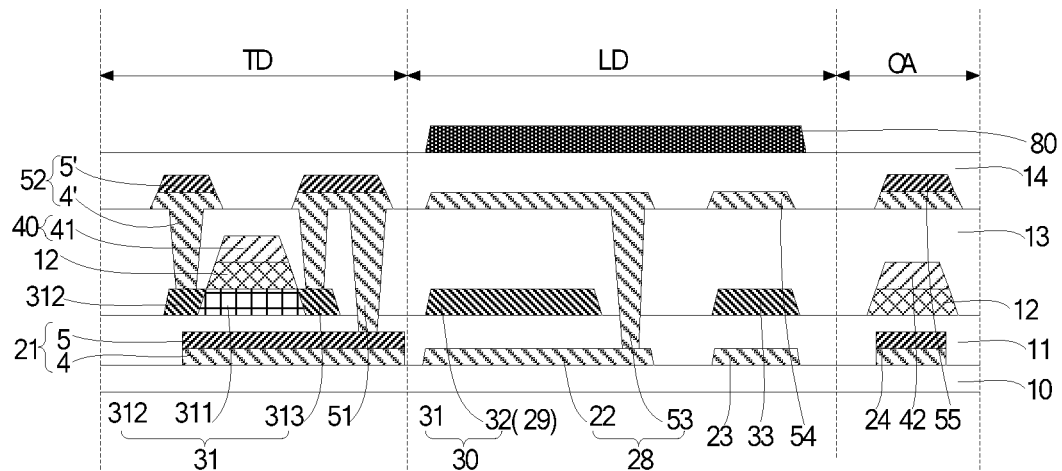

Specifically, please refer to FIG. 11. A deposition process such as PECVD is used to deposit an inorganic thin film as the passivation layer 14 on the third metal layer 50 and the interlayer dielectric layer 13, and the color filter layer 80 is prepared on the passivation layer 14 and is located corresponding to the light-emitting area LD.

S307: fabricating a planarization layer 15 on the color filter layer 80 and the passivation layer 14, and forming a pixel electrode 60 on the planarization layer 15, wherein the pixel electrode 60 is connected to the source electrode 51 or the drain electrode 52.

Figure 12:
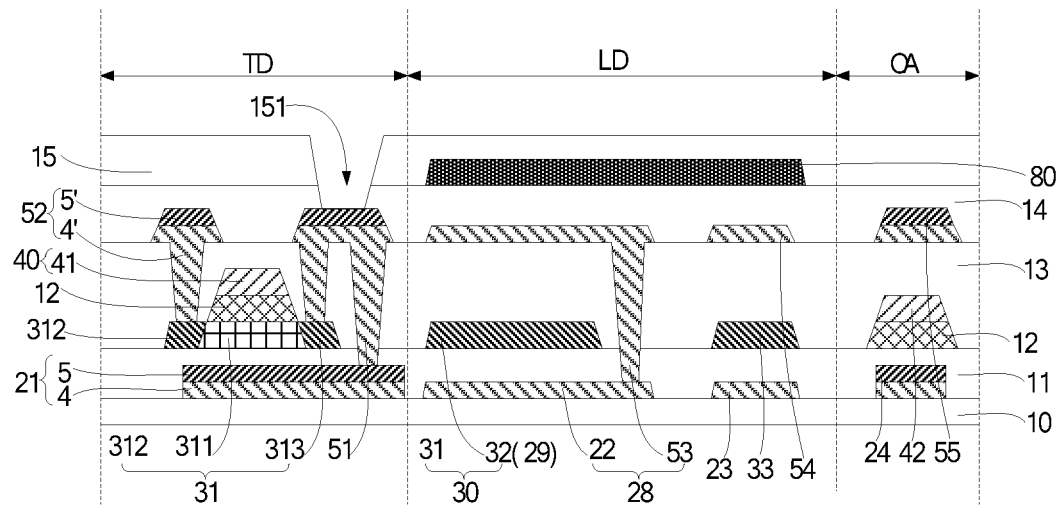

Specifically, please refer to FIG. 12. The color filter layer 80 and the passivation layer 14 are coated with an organic photoresist to form the planarization layer 15. The planarization layer 15 is patterned to form a sixth via 151 extending through the planarization layer 15 and the passivation layer 14 to expose the source electrode 51.

Figure 13:
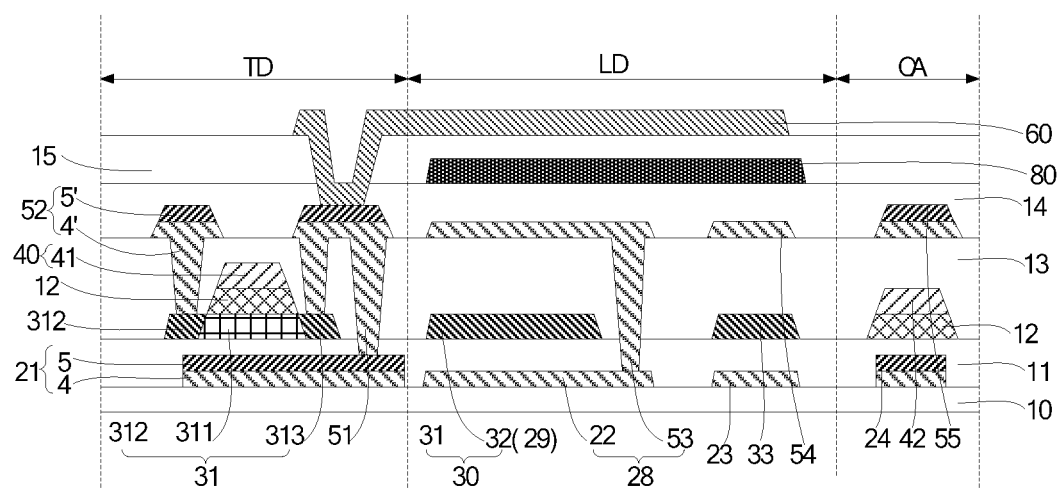

Further, a transparent conductive film, such as an ITO film, is deposited on the planarization layer 15. The transparent conductive film is patterned to form the pixel electrode 60, which is located corresponding to the color filter layer 80, and the pixel electrode 60 is connected to the source electrode 51 through the sixth via 151 of the planarization layer 15, as shown in FIG. 13.

Optionally, the pixel electrode 60 may also be connected to the drain electrode 52.

S308: forming a pixel definition layer 16 on the pixel electrode 60 and the planarization layer 15. A first via hole is defined in the pixel definition layer 16 and exposes the pixel electrode 60, and the light-emitting unit 3 is disposed in the first via hole and located corresponding to the color filter layer 80.

Figure 14:
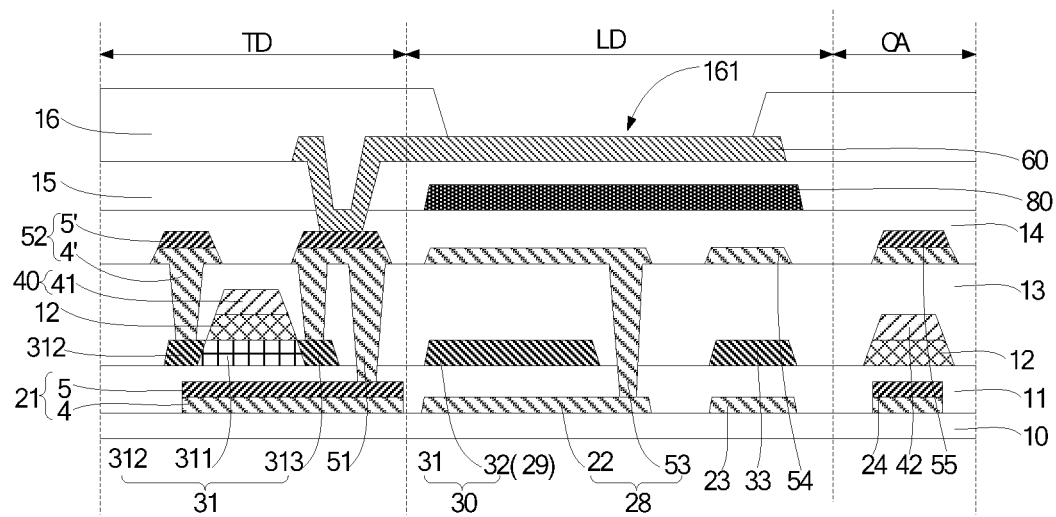

Specifically, please refer to FIG. 14. The pixel electrode 60 and the planarization layer 15 are coated with an organic photoresist to form the pixel definition layer 16. The organic photoresist can be one of PI-based (polyimide), acrylic, or other organic photoresists. The pixel definition layer 16 is patterned to form a first via hole 161 at a position corresponding to the pixel electrode 60, and the first via hole 161 exposes the pixel electrode 60.

Figure 15:
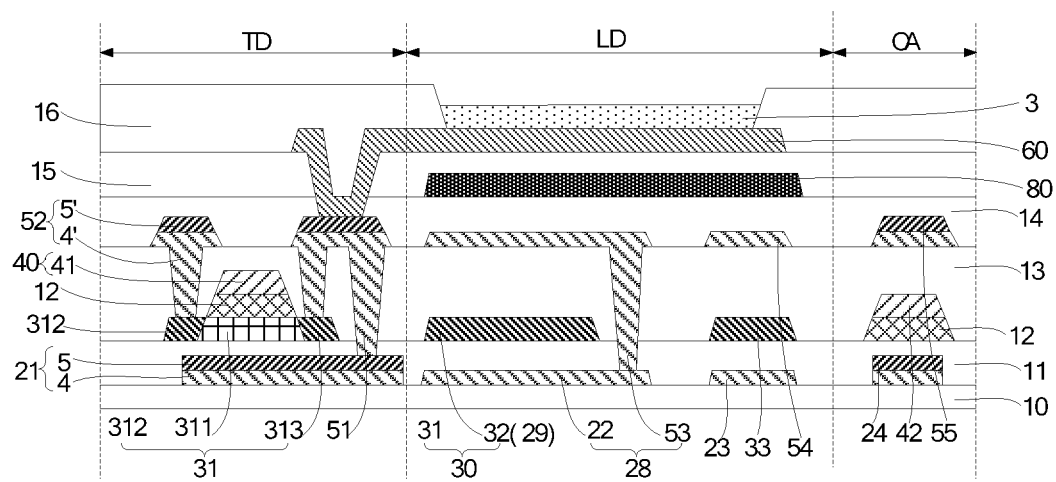

Further, please refer to FIG. 15. The light-emitting unit 3 is disposed in the first via hole 161 and is located corresponding to the color filter layer 80. The color filter layer 80 includes a red color film, a green color film, and a blue color film, and each light-emitting unit 3 corresponds to one of the color films of one color. A white light emitted by the light-emitting unit 3 is converted into a red light through the red color film, converted into a green light through the green color film, and converted into a blue light through the blue color film, thereby realizing color display of the display panel.

S309: fabricating a cathode 70 on the light-emitting unit 3 and the pixel defining layer 16.

Specifically, a third metal film is deposited on the light-emitting unit 3 and the pixel definition layer 16, and the third metal film is patterned to form the cathode 70, as shown in FIG. 4. The light-emitting unit 3 emits light under a combined action of the pixel electrode 60 and the cathode 70. Since the display panel of the present application is a bottom-emission type display panel, the cathode 70 may be a reflective electrode to improve a light utilization rate of the light-emitting unit 3.

Optionally, the method of manufacturing the display panel further includes fabricating an encapsulation layer on the cathode 70. The encapsulation layer can be a thin-film encapsulation structure. The thin-film encapsulation structure may be a laminated structure formed by three film layers of a first inorganic encapsulation layer, an organic encapsulation layer, and a second inorganic encapsulation layer sequentially laminated, or may be a laminated structure of more layers for protecting the light-emitting unit 3, thereby preventing moisture and oxygen from entering the light-emitting unit 3 that results in failure of light-emitting materials of the light-emitting unit 3.

It should be noted that in the method of manufacturing the display panel of the present application, a light output surface of the light-emitting unit 3 faces the storage capacitor 2, that is, the display panel adopts bottom emission. Since both the pixel electrode 60 and the storage capacitor 2 are made of transparent electrode materials, the light emitted by the light-emitting unit 3 can penetrate the pixel electrode 60 and the storage capacitor 2, and by disposing the storage capacitor 2 in the light-emitting unit 3, an area of a non-light-emitting area of the display panel is reduced, thereby increasing an aperture ratio of the display panel. Furthermore, by making the connecting wires of the pixel driving circuit into transparent wires in the light-emitting area LD, the area of the non-light-emitting area of the display panel can further be reduced, thereby further increasing the aperture ratio of the display panel.

In addition, the method of manufacturing the display panel of the present application is not limited to manufacture of the display panel illustrated in this embodiment, and the method of manufacturing the display panel of the present application can be used to manufacture any display panel in foregoing embodiments.

An embodiment of the present application further provides a display device, which includes the display panel of one of the foregoing embodiments, circuit boards and other devices bonded to the display panel, and a cover covering the display panel, etc.

According to the above-mentioned embodiments, it can be seen that the present application provides a display panel and a method of manufacturing the same, and a display device. Each of a first metal layer and a third metal layer of the display panel is constructed with a composite film layer having a first metal film and a transparent conductive film, and a halftone mask is used to perform a photolithography process on the first metal layer and a second metal layer. While forming a thin-film transistor device, a first plate of a transparent storage capacitor is formed in a light-emitting area, and a second plate of the transparent storage capacitor is formed in the light-emitting area at the same time as an active region is formed in a oxide semiconductor layer, so that light emitted by a light-emitting unit can pass through the storage capacitor, thereby increasing an aperture ratio of the display panel, as well as increasing a storage capacity of the storage capacitor. In addition, while forming a transparent first plate and a transparent second plate of the storage capacitor, a transparent wire is also formed in a corresponding light-emitting area, thereby further improving the aperture ratio of the display panel.

In the above-mentioned embodiments, the description of each embodiment has its own emphasis. For parts that are not described in detail in an embodiment, reference may be made to related descriptions of other embodiments.

The embodiments of the present application are described in detail above. Specific examples are used in this article to explain the principles and implementation of this application. The descriptions of the above embodiments are only used to help understand the technical solutions and core ideas of this application. Those of ordinary skill in the art should understand that they can still modify the technical solutions described in the foregoing embodiments, or equivalently replace some of the technical features; and these modifications or replacements do not cause the essence of the corresponding technical solutions to deviate from the scope of the technical solutions of the embodiments of the present application.

What is claimed is:

1. A display panel including a first metal layer, a second metal layer, a third metal layer, and an oxide semiconductor layer, the display panel comprising a plurality of subpixels, each of the subpixels comprising a transistor area and a light-emitting area, the transistor area provided with a thin-film transistor, the light-emitting area provided with a storage capacitor and a light-emitting unit located above the storage capacitor, and the light-emitting unit having a light output surface facing the storage capacitor, wherein the display panel comprises:

a substrate;

the first metal layer disposed on the substrate and comprising a light-shielding layer having a two-layered structure disposed in the transistor area, and a first transparent conductive electrode having a single-layered structure disposed in the light-emitting area;

the oxide semiconductor layer disposed on the first metal layer and comprising an active region of the thin-film transistor disposed in the transistor area and a second transparent conductive electrode disposed in the light-emitting area;

the second metal layer disposed on the oxide semiconductor layer and comprising a gate electrode of the thin-film transistor in the transistor area; and the third metal layer disposed on the second metal layer and comprising a source electrode and a drain electrode each having a two-layered structure disposed in the transistor area, and a third transparent conductive electrode having a single-layered structure disposed in the light-emitting area;

wherein a first plate of the storage capacitor is defined by an electrical connection of the first transparent conductive electrode and the third transparent conductive electrode, and a second plate of the storage capacitor is defined by the second transparent conductive electrode; and wherein at least one of the first metal layer, the oxide semiconductor layer, or the third metal layer in the light-emitting area further comprises a transparent wire having a single-layered structure, and the transparent wire is disposed corresponding to the light-emitting unit.

2. The display panel including the first metal layer, the second metal layer, the third metal layer, and the oxide semiconductor layer of claim 1, wherein each of the source electrode, the drain electrode, and the light-shielding layer comprises a transparent conductive film and a first metal film laminated together, wherein the first metal film is disposed on the transparent conductive film.

3. The display panel including the first metal layer, the second metal layer, the third metal layer, and the oxide semiconductor layer of claim 2, wherein each of the first transparent conductive electrode and the second transparent conductive electrode comprises the transparent conductive film.

4. The display panel including the first metal layer, the second metal layer, the third metal layer, and the oxide semiconductor layer of claim 3, further comprising an outer trace area, wherein the light-emitting area is defined between the transistor area and the outer trace area, and at least one of the first metal layer or the third metal layer further comprises an outer trace having a two-layered structure in the outer trace area.

5. The display panel including the first metal layer, the second metal layer, the third metal layer, and the oxide semiconductor layer claim 2, wherein the transparent conductive film comprises a film made of indium-based, zinc-based, or titanium-based doped transparent oxide materials.

6. The display panel including the first metal layer, the second metal layer, the third metal layer, and the oxide semiconductor layer of claim 2, wherein the first metal film is made of a material comprising one or a combination of molybdenum (Mo), aluminum (Al), titanium (Ti), or copper (Cu).

7. The display panel including the first metal layer, the second metal layer, the third metal layer, and the oxide semiconductor layer of claim 1, further comprising a passivation layer, a planarization layer, a pixel electrode, and a pixel definition layer disposed in a stacked arrangement on the third metal layer, wherein a first via hole is defined on the pixel definition layer, the first via hole exposes the pixel electrode, and the light-emitting unit is disposed in the first via hole.

8. The display panel including the first metal layer, the second metal layer, the third metal layer, and the oxide semiconductor layer of claim 7, wherein the display panel further comprises a color filter layer disposed between the passivation layer and the planarization layer and located corresponding to the first via hole.

9. The display panel including the first metal layer, the second metal layer, the third metal layer, and the oxide semiconductor layer of claim 8, wherein an orthographic projection of the color filter layer on the substrate covers an orthographic projection of the light-emitting unit on the substrate.

10. A method of manufacturing a display panel including a first metal layer, a second metal layer, a third metal layer, and a oxide semiconductor layer, wherein the display panel comprises a plurality of subpixels, each of the subpixels comprising a transistor area and a light-emitting area, the transistor area provided with a thin-film transistor, the light-emitting area provided with a storage capacitor and a light-emitting unit located above the storage capacitor, and the light-emitting unit having a light output surface facing the storage capacitor, wherein the method of manufacturing the display panel comprises:
providing a substrate;
fabricating a first composite metal layer on the substrate, performing a photolithography process by a first half-tone mask on the first composite metal layer to form the first metal layer, wherein the first metal layer comprises a light-shielding layer having a two-layered structure disposed in the transistor area, and a first transparent conductive electrode having a single-layered structure disposed in the light-emitting area;
fabricating a buffer layer on the first metal layer, preparing an oxide semiconductor film on the buffer layer, and performing a photolithography process on the oxide semiconductor film to form the oxide semiconductor layer, wherein the oxide semiconductor layer comprises an active region of the thin-film transistor disposed in the transistor area and an oxide semiconductor pattern formed in the light-emitting area;
fabricating a gate insulating layer on the oxide semiconductor layer and preparing a second metal film on the gate insulating layer, performing a photolithography process on the second metal film to form the second metal layer, wherein the second metal layer comprises a gate electrode of the thin-film transistor in the transistor area, and conductorizing the oxide semiconductor layer, so that the oxide semiconductor pattern is formed into a second transparent conductive electrode; and
fabricating an interlayer dielectric layer on the second metal layer, preparing a second composite metal layer on the interlayer dielectric layer, and performing a photolithography process by a second halftone mask on the second composite metal layer to form the third metal layer, wherein the third metal layer comprises a source electrode and a drain electrode each having a two-layered structure formed in the transistor area, and a third transparent conductive electrode having a single-layered structure formed in the light-emitting area, wherein the third transparent conductive electrode and the first transparent conductive electrode are electrically connected to form a first plate of the storage capacitor, and the second transparent conductive electrode is formed as a second plate of the storage capacitor; and
wherein at least one of the first metal layer, the oxide semiconductor layer, or the third metal layer in the light-emitting area further comprises a transparent wire having a single-layered structure, and the transparent wire is disposed corresponding to the light-emitting unit.

11. The method of manufacturing the display panel including the first metal layer, the second metal layer, the third metal layer, and the oxide semiconductor layer of claim 10, wherein the step of fabricating the first composite metal layer on the substrate, performing the photolithography process by the first halftone mask on the first composite metal layer to form the first metal layer comprises:
depositing the first composite metal layer on the substrate;
coating a full surface of the first composite metal layer with a photoresist;
exposing and developing the photoresist through the first halftone mask to form a plurality of photoresist patterns, wherein the photoresist patterns comprise a first photoresist pattern formed in the transistor area, a second photoresist pattern and a third photoresist pattern formed in the light-emitting area, and a fourth photoresist pattern formed in an outer trace area;
performing, using the photoresist patterns as a shield, a first etching on the first composite metal layer;
performing an ashing treatment on the photoresist patterns to reduce thicknesses of the first photoresist pattern and the fourth photoresist pattern and to ash the second photoresist pattern and the third photoresist pattern completely;

performing, using a thinned first photoresist pattern and a thinned fourth photoresist pattern as a shield, a second etching on the first composite metal layer to form the first metal layer; and peeling off the thinned first photoresist pattern and the thinned fourth photoresist pattern to expose the first metal layer completely.

12. The method of manufacturing the display panel including the first metal layer, the second metal layer, the third metal layer, and the oxide semiconductor layer of claim 11, wherein at least one of the first metal layer or the third metal layer further comprises an outer trace having a two-layered structure in the outer trace area.

13. The method of manufacturing the display panel including the first metal layer, the second metal layer, the third metal layer, and the oxide semiconductor layer of claim 11, wherein the light-emitting area is defined between the transistor area and the outer trace area.

14. The method of manufacturing the display panel including the first metal layer, the second metal layer, the third metal layer, and the oxide semiconductor layer of claim 10, further comprising:

fabricating a passivation layer on the third metal layer, and preparing a color filter layer on the passivation layer, wherein the color filter layer is located corresponding to the light-emitting area;

forming a planarization layer on the passivation layer and the color filter layer, and preparing a pixel electrode on the planarization layer, wherein the pixel electrode is connected to the source electrode and the drain electrode;

forming a pixel definition layer on the pixel electrode and the planarization layer, wherein a first via hole is defined in the pixel definition layer, the first via hole exposes the pixel electrode, and the light-emitting unit is disposed in the first via hole and located corresponding to the color filter layer; and fabricating a cathode on the light-emitting unit and the pixel definition layer.

15. The method of manufacturing the display panel including the first metal layer, the second metal layer, the third metal layer, and the oxide semiconductor layer of claim 14, wherein an orthographic projection of the color filter layer on the substrate covers an orthographic projection of the light-emitting unit on the substrate.

16. The method of manufacturing the display panel including the first metal layer, the second metal layer, the third metal layer, and the oxide semiconductor layer of claim 10, wherein each of the first composite metal layer and the second composite metal layer comprises a transparent conductive film and a first metal film laminated together, wherein the first metal film is disposed on the transparent conductive film.

17. The method of manufacturing the display panel including the first metal layer, the second metal layer, the third metal layer, and the oxide semiconductor layer of claim 16, wherein each of the first transparent conductive electrode and the second transparent conductive electrode comprises the transparent conductive film.

18. The method of manufacturing the display panel including the first metal layer, the second metal layer, the third metal layer, and the oxide semiconductor layer of claim 16, wherein the transparent conductive film comprises a film made of indium-based, zinc-based, or titanium-based doped transparent oxide materials.

19. The method of manufacturing the display panel including the first metal layer, the second metal layer, the third metal layer, and the oxide semiconductor layer of claim 16, wherein the first metal film is made of a material comprising one or a combination of molybdenum (Mo), aluminum (AI), titanium (Ti), or copper (Cu).

20. The method of manufacturing the display panel including the first metal layer, the second metal layer, the third metal layer, and the oxide semiconductor layer of claim 10, wherein the oxide semiconductor layer comprises a film made of indium-gallium-zinc oxide (IGZO), indium zinc oxide (IZO), or indium zinc tin oxide (IZTO).

* * * * *